United States Patent
Zhang et al.

[11] Patent Number: 6,004,722
[45] Date of Patent: Dec. 21, 1999

[54] HYDROLYTICALLY STABLE ORGANIC POLYMER MATERIAL FOR ORGANIC POLYMER ANTI-REFLECTIVE (ARC) LAYER

[75] Inventors: Ai-Qiang Zhang; Jian-Hui Ye, both of Singapore, Singapore

[73] Assignee: Chartered Semiconductor Manufacturing Ltd., Singapore, Singapore

[21] Appl. No.: 09/055,440

[22] Filed: Apr. 6, 1998

[51] Int. Cl.$^6$ .................................................. G03C 1/492
[52] U.S. Cl. ..................... 430/271.1; 430/275.1; 430/313
[58] Field of Search ............... 430/271.1, 275.1, 430/313

[56] References Cited

U.S. PATENT DOCUMENTS

| | | | |
|---|---|---|---|
| 4,617,252 | 10/1986 | Cordes, III et al. | 430/272 |
| 4,927,736 | 5/1990 | Mueller et al. | 430/275 |
| 5,320,935 | 6/1994 | Maeda et al. | 430/325 |
| 5,342,739 | 8/1994 | Katou et al. | 430/325 |
| 5,482,817 | 1/1996 | Dichiara et al. | 430/271.1 |
| 5,578,676 | 11/1996 | Flaim et al. | 524/609 |

*Primary Examiner*—Janet Baxter
*Assistant Examiner*—Rosemary Ashton
*Attorney, Agent, or Firm*—George O. Saile; Rosemary L. S. Pike; Alek P. Szecsy

[57] ABSTRACT

A method for forming an anti-reflective coating (ARC) layer within a fabrication and a fabrication having the anti-reflective coating (ARC) layer formed therein. To practice the method, there is first provided a substrate. There is then formed over the substrate a reflective layer. There is then formed upon the reflective layer an organic polymer anti-reflective coating (ARC) layer, where the organic polymer anti-reflective coating (ARC) layer is formed from an organic polymer anti-reflective coating (ARC) material which is not susceptible to a hydrolysis reaction. There may then be formed upon the organic polymer anti-reflective coating (ARC) layer a photoresist layer which is photoexposed and developed to form a patterned photoresist layer which may be employed as an etch mask for forming a patterned reflective layer from the reflective layer. The patterned reflective layer so formed is formed with uniform and reproducible linewidth dimension.

11 Claims, 7 Drawing Sheets

HYDROLYTICALLY STABLE ORGANIC POLYMER MATERIAL FOR ORGANIC POLYMER ANTI-REFLECTIVE (ARC) LAYER

BACKGROUND OF THE INVENTION

1. Field of the Invention

The present invention relates generally to anti-reflective coating (ARC) layers employed within fabrications having reflective layers formed therein. More particularly, the present invention relates to organic polymer anti-reflective coating (ARC) layers employed within fabrications having reflective layers formed therein.

2. Description of the Related Art

Microelectronics fabrications are formed from microelectronics substrates over which are formed patterned microelectronics conductor layers which are separated by microelectronics dielectric layers.

In the process of forming patterned microelectronics conductor layers within microelectronics fabrications, as well as forming other patterned reflective layers within microelectronics fabrications, it is common in the art of microelectronics fabrication to employ an anti-reflective coating (ARC) layer formed interposed between: (1) a blanket reflective layer from which is formed the patterned reflective layer, such as the patterned conductor layer; and (2) a blanket photoresist layer from which is subsequently formed a patterned photoresist layer which is employed to define the patterned reflective layer, such as the patterned conductor layer. Such blanket anti-reflective coating (ARC) layers are desirable within microelectronics fabrications since they attenuate standing wave reflections from the blanket reflective layer when photoexposing the blanket photoresist layer, which standing wave reflections would otherwise lead to inhomogeneous photoexposures of the blanket photoresist layer and an attendant compromise of the patterned photoresist layer linewidth uniformity and reproducibility, which in turn leads to a correlating compromise of the patterned reflective layer linewidth uniformity and reproducibility.

Although blanket anti-reflective coating (ARC) layers may be formed within microelectronics fabrications from any of several anti-reflective coating (ARC) materials, such as but not limited to inorganic thin film anti-reflective coating (ARC) materials and organic polymer anti-reflective coating (ARC) materials, organic polymer anti-reflective coating (ARC) materials are often preferred when forming anti-reflective coating (ARC) layers within microelectronics fabrications since organic polymer anti-reflective coating (ARC) materials may be coated onto reflective layers within microelectronics fabrications through use of methods analogous or equivalent to methods employed in forming blanket photoresist layers upon those blanket organic polymer anti-reflective coating (ARC) layers within those microelectronics fabrications.

While anti-reflective coating (ARC) layers formed from organic polymer anti-reflective coating (ARC) materials are thus desirable within the art of microelectronics fabrication, anti-reflective coating (ARC) layers formed from organic polymer anti-reflective coating materials are not formed entirely without problems within microelectronics fabrications.

In particular, it is known in the art of microelectronics fabrication that anti-reflective coating (ARC) layers when formed from polyimide organic polymer anti-reflective coating (ARC) material compositions incorporating dyes, additives and solvents as are appropriate to specific microelectronics fabrications often suffer from problems including but not limited to: (1) void formation, such as pinhole void formation, within the polyimide organic polymer anti-reflective coating (ARC) layers; and (2) delamination of the polyimide organic polymer anti-reflective coating (ARC) layers from blanket reflective layers or blanket photoresist layers interposed between which the organic polymer anti-reflective coating (ARC) layers are formed. Problems such as void formation within polyimide organic polymer anti-reflective coating (ARC) layers within microelectronics fabrication and delamination of polyimide organic polymer anti-reflective coating (ARC) layers from adjoining layers within microelectronics fabrications are undesirable within the art of microelectronics fabrication since such problems often contribute to difficulties in ultimately forming patterned reflective layers of uniform and reproducible linewidth within microelectronics fabrications.

It is thus towards the goal of forming organic polymer anti-reflective coating (ARC) layers within microelectronics fabrications with attenuated void formation within those organic polymer anti-reflective coating (ARC) layers and with attenuated delamination of those organic polymer anti-reflective coating (ARC) layers from adjoining layers within the microelectronics fabrications within which are formed those organic polymer anti-reflective coating (ARC) layers that the present invention is directed.

Various polyimide organic polymers materials, polyimide organic polymer material compositions and uses thereof, have been disclosed in the art of microelectronics fabrication.

For example, Mueller et al., in U.S. Pat. No. 4,927,736, discloses a series of hydroxy polyimide organic polymer materials and a series of high temperature positive photoresist compositions which may be formed from the series of hydroxy polyimide organic polymer materials. The hydroxy polyimide organic polymer materials may be synthesized by condensation of an appropriate hydroxy substituted aminophenol with an appropriate dianhydride to form a hydroxy polyimide organic polymer material which may be incorporated into a high temperature positive photoresist composition from which may be formed a high temperature positive photoresist layer which in turn may be developed with an aqueous base developer.

In addition, Maeda et al., in U.S. Pat. No. 5,320,935, discloses a method for forming a series of poly(amide)imide precursor polymer materials having pendant hydroxyphenyl groups, where the poly(amide)imide precursor polymer materials may be employed within high temperature photoresist compositions. The high temperature photoresist compositions in turn exhibit excellent shelf stability and good photosensitivity.

Finally, Katou et al., in U.S. Pat. No. 5,342,739, which is related to and co-assigned with U.S. Pat. No. 5,320,935, disclose a method for forming a negative photoresist pattern employing a negative photoresist composition formed in part from the poly(amide)imide precursor polymer materials disclosed within U.S. Pat. No. 5,342,739. The negative photoresist composition additionally employs a quinonediazide in conjunction with a poly(amide)imide precursor polymer material to form the negative photoresist composition having the excellent shelf stability and the good photosensitivity.

Desirable in the art of microelectronics fabrication are methods and materials through which there may be formed organic polymer anti-reflective coating (ARC) layers within microelectronics fabrications, where the organic polymer anti-reflective coating (ARC) layers when formed within the microelectronics fabrications have: (1) attenuated pinhole formation within the organic polymer anti-reflective coating (ARC) layers; and (2) attenuated delamination of the organic polymer anti-reflective coating (ARC) layers from layers adjoining the organic polymer anti-reflective coating (ARC) layers. It is towards the foregoing goals that the present invention is directed.

SUMMARY OF THE INVENTION

A first object of the present invention is to provide a method for forming an organic polymer anti-reflective coating (ARC) layer within a microelectronics fabrication.

A second object of the present invention is to provide a method in accord with the first object of the present invention, where the organic polymer anti-reflective coating layer is formed with attenuated void formation within the organic polymer anti-reflective coating (ARC) layer and with attenuated delamination of the organic polymer anti-reflective coating (ARC) layer from layers adjoining the organic polymer anti-reflective coating (ARC) layer.

A third object of the present invention is to provide a method in accord with the first object of the present invention and the second object of the present invention, which method is readily commercially implemented.

In accord with the objects of the present invention, there is provided by the present invention a method for forming an organic polymer anti-reflective coating (ARC) layer within a fabrication having a reflective layer formed therein, as well as the fabrication having both the reflective layer and the organic polymer anti-reflective coating (ARC) layer formed therein. To practice the method of the present invention, there is first provided a substrate. There is then formed over the substrate a reflective layer. There is then formed upon the reflective layer an organic polymer anti-reflective coating (ARC) layer, where the organic polymer anti-reflective coating (ARC) layer is formed from an organic polymer anti-reflective coating (ARC) material which is not susceptible to a hydrolysis reaction. The method of the present invention contemplates a fabrication, such as but not limited to a microelectronics fabrication, formed in accord with the method of the present invention.

There may subsequently for formed upon the organic polymer anti-reflective coating (ARC) formed through the method of the present invention a blanket photoresist layer which is subsequently photolithographically exposed and developed to form a patterned photoresist layer which may be employed as an etch mask layer for forming a patterned reflective layer from the reflective layer.

The present invention provides a method for forming an organic polymer anti-reflective coating (ARC) layer within a fabrication having a reflective layer formed therein, where the organic polymer anti-reflective coating (ARC) layer is formed with attenuated void formation within the organic polymer anti-reflective coating (ARC) layer and with attenuated delamination of the organic polymer anti-reflective coating (ARC) layer from layers adjoining the organic polymer anti-reflective coating (ARC) layer. The method of the present invention realizes the foregoing objects by employing when forming the organic polymer anti-reflective coating (ARC) layer an organic polymer anti-reflective coating (ARC) material which is not susceptible to a hydrolysis reaction. By employing when forming the organic polymer anti-reflective coating (ARC) layer an organic polymer anti-reflective coating (ARC) material which is not susceptible to the hydrolysis reaction, there is provided an organic polymer anti-reflective coating (ARC) layer which is not susceptible to reversible moisture sorbtion based depolymerization degradation of the organic polymer anti-reflective coating (ARC) material and moisture desorbtion based repolymerization of the organic polymer anti-reflective coating (ARC) material which leads to: (1) voids, such as but not limited to pinhole voids, formed within or through the organic polymer anti-reflective coating (ARC) layer; or (2) delamination of the organic polymer anti-reflective coating (ARC) layer from layers adjoining the organic polymer anti-reflective coating (ARC) layer.

The method of the present invention is readily commercially implemented. As is illustrated within the preferred embodiments of the present invention, materials through which may be formed an organic polymer anti-reflective coating (ARC) layer in accord with the method of the present invention are generally known. Thus, the method of the present invention is readily commercially implemented to form a fabrication having a reflective layer and an organic polymer anti-reflective coating (ARC) layer formed therein in accord with the method of the present invention.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming an organic polymer anti-reflective coating (ARC) layer within a fabrication having a reflective layer formed therein, where the organic polymer anti-reflective coating (ARC) layer is formed with: (1) attenuated void formation within the organic polymer anti-reflective coating (ARC) layer; and (2) attenuated delamination of the organic polymer anti-reflective coating (ARC) layer from layers adjoining the organic polymer anti-reflective coating (ARC) layer. The method of the present invention realizes the foregoing objects by employing when forming the organic polymer anti-reflective coating (ARC) layer an organic polymer anti-reflective coating (ARC) material which is not susceptible to a hydrolysis reaction. By employing when forming the organic polymer anti-reflective coating (ARC) layer an organic polymer anti-reflective coating (ARC) material which is not susceptible to a hydrolysis reaction, there is provided an organic polymer anti-reflective coating (ARC) layer which is not susceptible to sequential hydrolysis and dehydration induced degradation within the organic polymer anti-reflective coating (ARC) layer which leads to: (1) voids, such as but not limited to pinhole voids, formed within or through the organic polymer anti-reflective coating (ARC) layer; or (2) delamination of the organic polymer anti-reflective coating (ARC) layer from layers adjoining the organic polymer anti-reflective coating (ARC) layer.

Figure 1:
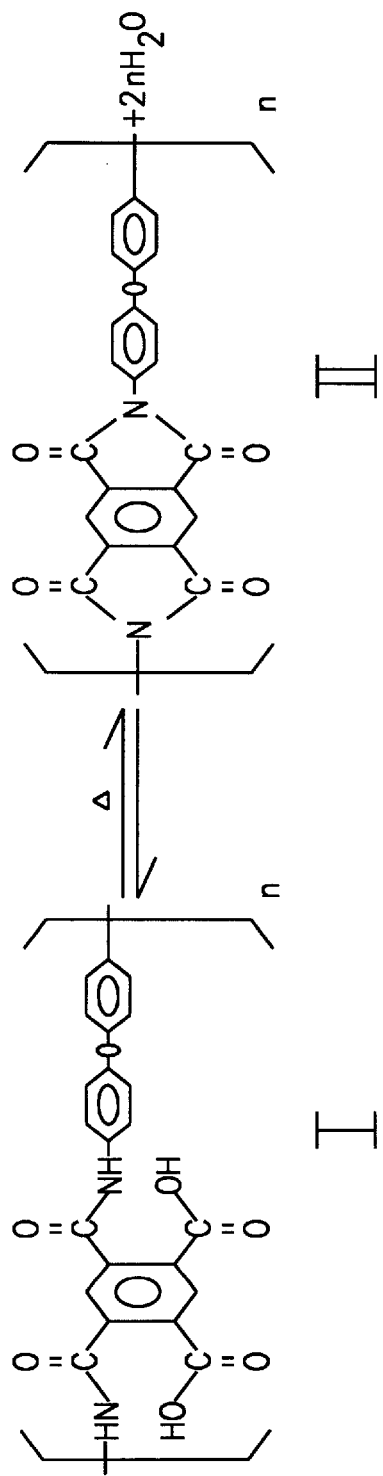
FIG. 1 shows a chemical reaction equilibrium illustrating a polyamic acid polymer material dehydration condensation reaction to form a polyimide polymer material, and the polyimide polymer material reverse hydrolysis reaction to form the polyamic acid polymer material.

To better understand the preferred embodiments of the present invention there is first shown in FIG. 1 a chemical reaction equilibrium illustrating a polyamic acid polymer material I dehydration condensation reaction to form a polyimide polymer material II, and the polyimide polymer material II reverse hydrolysis reaction to form the polyamic acid polymer material I. Within the chemical reaction equilibrium of FIG. 1, the polyamic acid polymer material I dehydrates under the influence of heat to form the polyimide polymer material II, while the polyimide polymer material II undergoes a hydrolysis reaction in the presence of moisture to form the polyamic acid polymer material I.

When an organic polymer anti-reflective coating (ARC) layer is formed of a composition comprising a polyimide polymer material such as the polyimide polymer material II, and exposed to ambient moisture in the form of humidity, a polyamic acid polymer material, such as the polyamic acid polymer material I, is formed within the organic polymer anti-reflective coating (ARC) layer. When the organic polymer anti-reflective coating (ARC) layer is subsequently coated with a photoresist layer and baked to cure the photoresist layer, as is conventional in the art of microelectronics fabrication, the polyamic acid polymer material again dehydrates to form the polyimide polymer material. The moisture entrapped within the polyimide polymer material incident to the polyamic acid polymer material to polyimide polymer material dehydration reaction, upon heating to a sufficiently high temperature, assists in: (1) forming voids within or through the polyimide organic polymer anti-reflective coating (ARC) layer; or (2) delaminating the polyimide organic polymer anti-reflective coating (ARC) layer from layers adjoining the polyimide organic polymer anti-reflective coating (ARC) layer.

In order to attenuate void formation within organic polymer anti-reflective coating (ARC) layers and to attenuate delamination of organic polymer anti-reflective coating (ARC) layers from layers adjoining organic polymer anti-reflective coating (ARC) layers, the present invention provides that an organic polymer material from which is formed an organic polymer anti-reflective coating (ARC) layer is an organic polymer material which is not susceptible to a hydrolysis reaction. Such organic polymer materials will typically be formed from organic polymer materials which have absent therein amide bonds and ester bonds which are susceptible to hydrolysis. Thus, organic polymer anti-reflective coating (ARC) materials employed within the present invention may be organic polymer materials formed through condensation reactions which yield reaction products other than moisture, as well as organic polymer materials formed through addition polymerization reactions.

Within the preferred embodiments of the present invention, it has been found experimentally that a particularly desirable organic polymer anti-reflective coating (ARC) material from which may be formed an organic polymer anti-reflective coating (ARC) layer in accord with the preferred embodiment of the present invention is a polyorthoaminophenol organic polymer anti-reflective coating (ARC) material. A chemical reaction equilibrium illustrating an orthoaminophenol material dehydrogenation reaction to form a polyorthoaminophenol polymer material, and the polyorthoaminophenol polymer material reverse hydrogenation decomposition reaction to form the orthoaminophenol material, is shown in FIG. 2.

Figure 2:
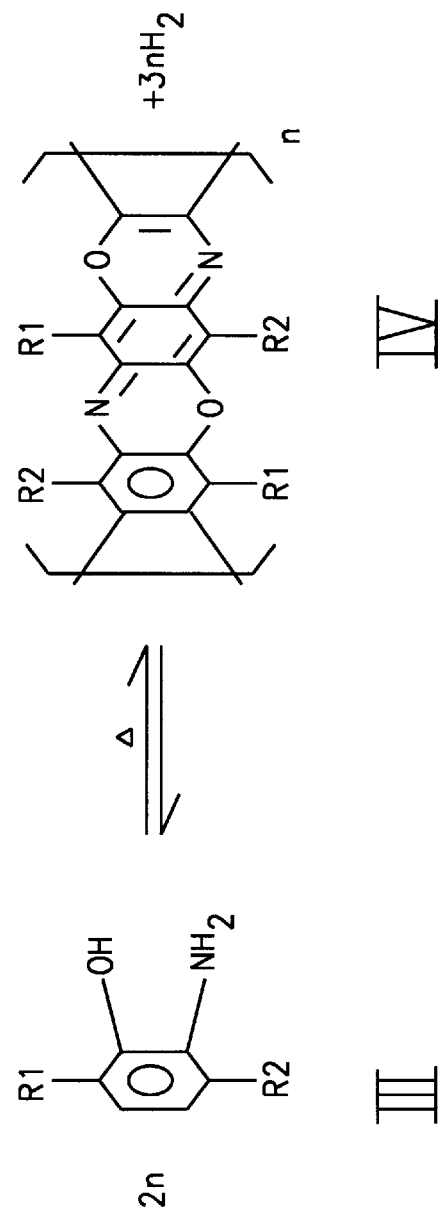
FIG. 2 shows a chemical reaction equilibrium illustrating an orthoaminophenol material dehydrogenation reaction to form a polyorthoaminophenol polymer material, and the polyorthoaminophenol polymer material reverse hydrogenation decomposition reaction to form the orthoaminophenol material.

As is seen in FIG. 2, an orthoaminophenol material III is dehydrogenated when forming a corresponding polyorthoaminophenol polymer material IV. Since hydrogen is quite volatile and readily extracted from the polyorthoaminophenol polymer material IV, and hydrogen is typically not adventitiously present when processing microelectronics fabrications or other fabrications having reflective layers formed therein, the reverse hydrogenation and decomposition reaction for forming the orthoaminophenol III from the corresponding polyorthoaminophenol IV, as illustrated in FIG. 2, is generally exceedingly negligible. Thus, there may be formed from the polyorthoaminophenol polymer material IV as illustrated in FIG. 2 an organic polymer anti-reflective coating (ARC) layer with attenuated void formation within the organic polymer anti-reflective coating (ARC) layer and with attenuated delamination of the organic polymer anti-reflective coating (ARC) layer from layers adjoining the organic polymer anti-reflective coating (ARC) layer.

Within the chemical reaction equilibrium illustrated within FIG. 2, the groups R1 and R2 within the orthoaminophenol material III and the polyorthoaminophenol polymer material IV may be any of several groups as are commonly employed within orthoaminophenol syntheses, provided that they do not appreciable impede the polyorthoaminophenol polymer material polymerization reaction as illustrated in FIG. 2. Such groups R1 and R2 may include, but are not limited to hydrogen, alkyl groups and aryl groups. Most commonly, R1 and R2 each equal hydrogen. Under circumstances where R1 and R2 each equal hydrogen, an organic polymer anti-reflective coating (ARC) layer formed from the polyorthoaminophenol polymer material IV as illustrated within FIG. 2 will typically provide a more hydrophobic surface than an organic polymer anti-reflective coating (ARC) layer formed from the polyimide polymer material II as illustrated in FIG. 1, which in turn will typically provide a more hydrophobic surface than an organic polymer anti-reflective coating (ARC) layer formed from the polyamic acid polymer material I as illustrated in FIG. 1. Hydrophobic organic polymer anti-reflective coating (ARC) layer surfaces are often desirable within microelectronics fabrication since such surfaces inhibit intermixing with hydrophilic polymer materials which are often employed within photoresist polymer compositions employed when fabricating microelectronics fabrications.

Particularly advantageous to organic polymer anti-reflective coating (ARC) layers formed of polyorthoaminophenol organic polymer anti-reflective coating (ARC)

materials in accord with the preferred embodiment of the present invention is that the polyorthoaminophenol organic polymer anti-reflective coating (ARC) materials inherently possess sufficiently strong absorption in the visible and ultraviolet wavelength regions to be employed as organic polymer anti-reflective coating (ARC) layers without addition of dye materials to organic polymer anti-reflective coating (ARC) compositions employing the polyorthoaminophenol organic polymer anti-reflective coating (ARC) materials.

Figure 3:
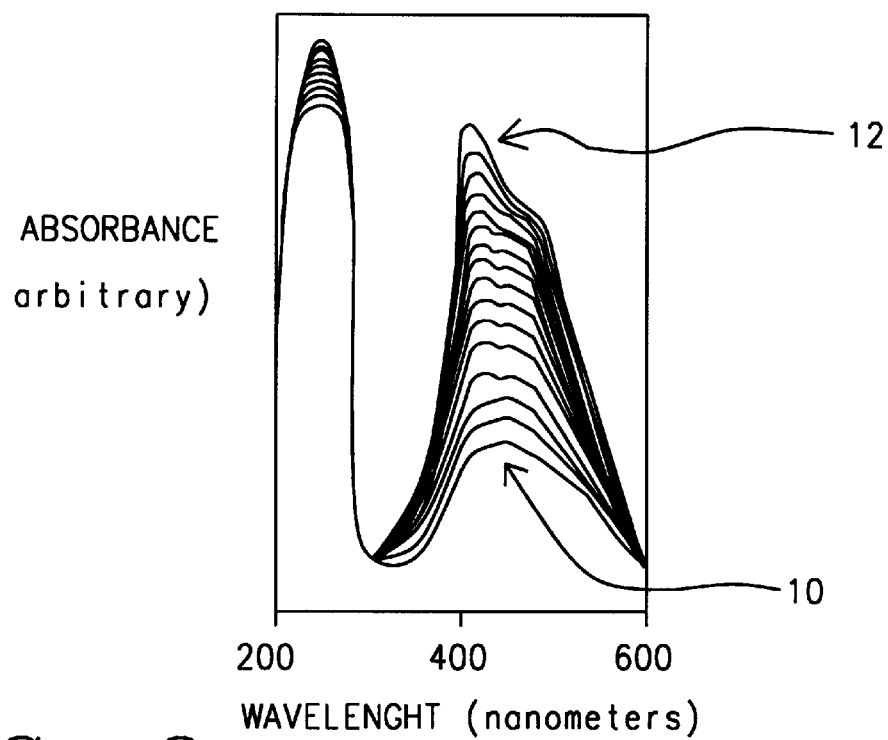
FIG. 3 shows an ultraviolet spectrum of a polyorthoaminophenol polymer material obtained incident to polymerization of orthoaminophenol.

A graph of absorbance versus wavelength for polyorthoaminophenol organic polymer anti-reflective coating (ARC) materials formed from polymerization of orthoaminophenol materials through the chemical reaction equilibrium of FIG. 2 (where R1 and R2 each equal hydrogen) is shown in FIG. 3. Within FIG. 3, curve 10 corresponds with the absorption spectrum of the orthoaminophenol material, while curve 12 corresponds with the absorption spectrum of the polyorthoaminophenol polymer material. The intervening curves illustrate intervening levels of polymerization of the orthoaminophenol material when forming the polyorthoaminophenol polymer material. As is illustrated in FIG. 3, there exist within the polyorthoaminophenol polymer material substantial peaks at 248 nanometers, 400 nanometers and 436 nanometers (absorbances of about 1.7 to about 3.0), along with a substantial absorption at 365 nanometers (absorbance of about 1.65 to about 1.75), thus providing within an organic polymer anti-reflective coating (ARC) layer formed employing the polyorthoaminophenol polymer material substantial absorption at conventional deep ultra-violet (DUV), i-line and g-line photoexposure radiation wavelengths. Similarly, the polyorthoaminophenol polymer material whose absorption spectrum is illustrated in FIG. 3 also has an index of refraction of about 1.699–0.175i, which index of refraction is also appropriate for photoexposure at conventional deep ultra-violet, i-line and g-line photoexposure radiation wavelengths.

First Preferred Embodiment

Figure 4:
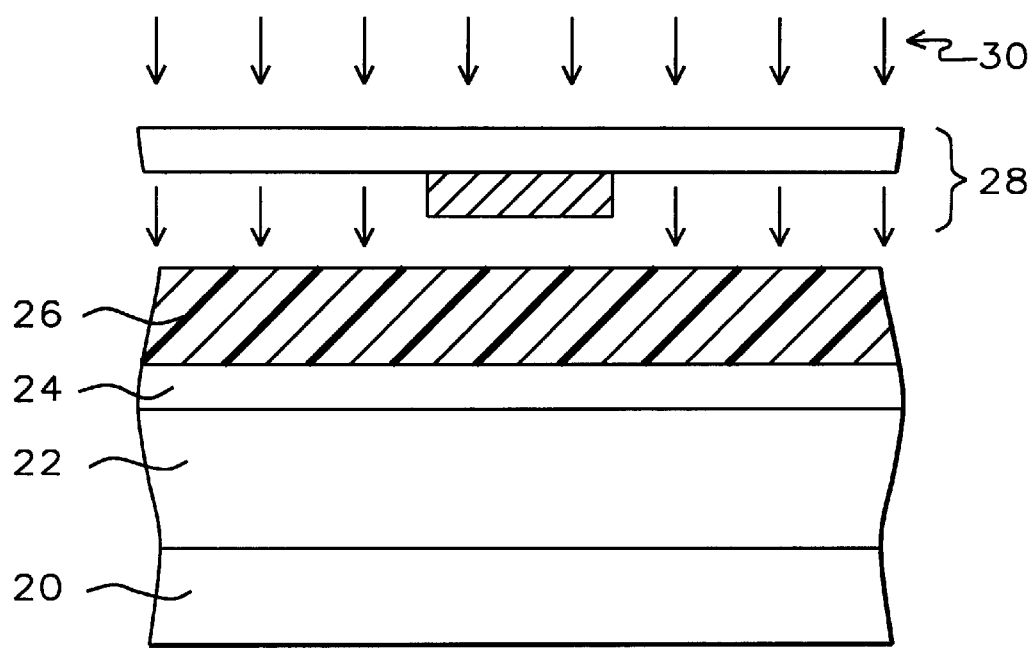
FIG. 4 to FIG. 6 show a series of schematic cross-sectional diagrams illustrating the results of forming, in accord with a general preferred embodiment of the present invention which comprises a first preferred embodiment of the present invention, a patterned reflective layer from a blanket reflective layer within a microelectronics fabrication while employing an organic polymer anti-reflective coating (ARC) layer formed from an organic polymer anti-reflective coating (ARC) material in accord with the present invention.
Figure 5:
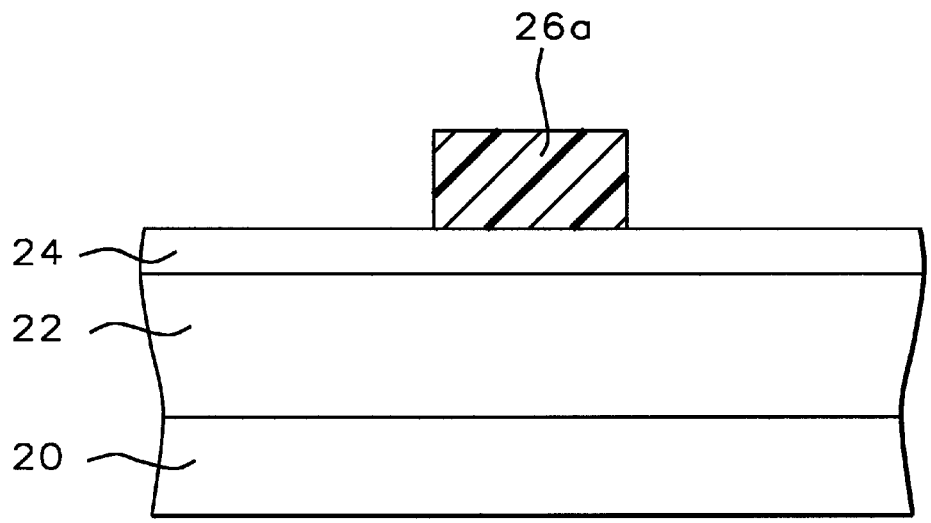
Figure 6:
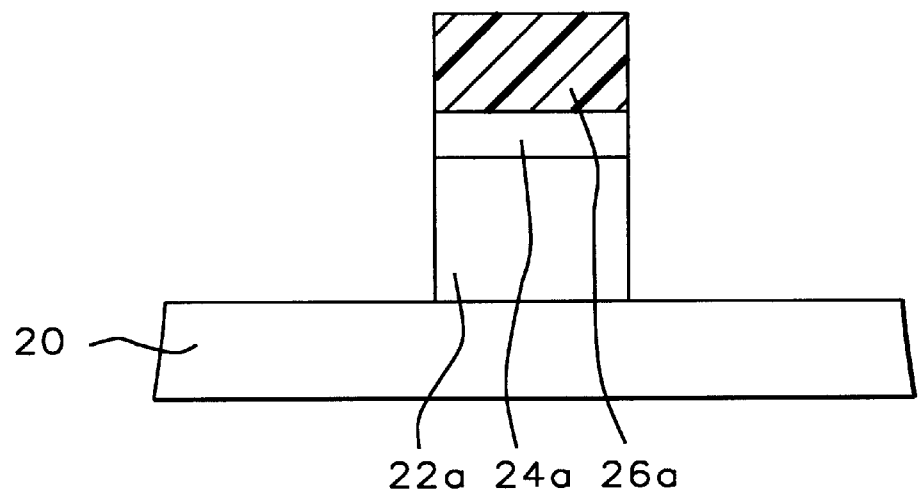

Referring now to FIG. 4 to FIG. 6, there is shown a series of schematic cross-sectional diagrams illustrating the results of forming, in accord with a general preferred embodiment of the present invention which comprises a first preferred embodiment of the present invention, a patterned reflective layer from a blanket reflective layer within a microelectronics fabrication. Although both the first preferred embodiment of the present invention and the second preferred embodiment of the present invention illustrate the present invention within the context of forming an organic polymer anti-reflective coating (ARC) layer upon a reflective layer within a microelectronics fabrication, it is understood by a person skilled in the art that the present invention also provides value when forming an organic polymer anti-reflective coating (ARC) layer upon a reflective layer within any other fabrication where it is desired to attenuate the reflection of the reflective layer. Such other fabrications may include, but are not limited to decoratively metallized ceramic substrate and/or polymer substrate fabrications. Shown in FIG. 4 is a schematic cross-sectional diagram of the microelectronics fabrication at an early stage in its fabrication.

Shown in FIG. 4 is a substrate 20 employed within a microelectronics fabrication, where the substrate 20 has formed thereover a blanket reflective layer 22 which in turn has formed thereupon a blanket organic polymer anti-reflective coating (ARC) layer 24, which similarly in turn has formed thereupon a blanket photoresist layer 26.

Within the first preferred embodiment of the present invention, the substrate 20 may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications. Similarly, although not specifically illustrated within the schematic cross-sectional diagram of FIG. 4, the substrate may be the substrate itself employed within the microelectronics fabrication, or the substrate 20 may alternatively be the substrate employed within the microelectronics fabrication, where the substrate has formed thereupon and/or thereover any of several additional layers which are commonly employed within the microelectronics fabrication. Such additional layers may include, but are not limited to conductor layers, semiconductor layers and dielectric layers as are commonly employed within the microelectronics fabrication.

Similarly, the blanket reflective layer 22 may be formed from any of several reflective materials as are common within the microelectronics fabrication within which is formed the blanket reflective layer 22. Such reflective materials may include, but are not limited to reflective conductor materials, reflective semiconductor materials and reflective dielectric materials. Preferably, the blanket reflective layer 22 is formed to a thickness of from about 1000 to about 15000 angstroms upon the substrate 20.

With respect to the blanket organic polymer anti-reflective coating (ARC) layer 24, the blanket organic polymer anti-reflective coating (ARC) layer 24 is preferably, as disclosed above, formed of an organic polymer anti-reflective coating (ARC) material which is not susceptible to a hydrolysis reaction, which will typically preclude when forming the organic polymer anti-reflective coating (ARC) layer 24 organic polymer anti-reflective coating (ARC) materials having formed therein amide bonds and/or ester bonds. More preferably, the organic polymer anti-reflective coating (ARC) layer 24 is formed of a polyorthoaminophenol organic polymer anti-reflective coating (ARC) material as disclosed above. Preferably, the blanket organic polymer anti-reflective coating (ARC) layer 24 so formed is formed to a thickness of from about 300 to about 1500 angstroms upon the blanket reflective layer 22.

Finally, with respect to the blanket photoresist layer 26, although the blanket photoresist layer 26 as illustrated within the schematic cross-sectional diagrams of FIG. 4 to FIG. 6 is a blanket positive photoresist layer, within the first preferred embodiment of the present invention the blanket photoresist layer 26 may be formed from any of several photoresist materials as are known in the art of microelectronics fabrication, including but not limited to photoresist materials selected from the general groups of photoresist materials including but not limited to positive photoresist materials and negative photoresist materials. Preferably, the blanket photoresist layer 26 is formed to a thickness of from about 6000 to about 20000 angstroms upon the blanket organic polymer anti-reflective coating (ARC) layer 24.

Finally, there is shown in FIG. 4 a photoexposure reticle 28 which is employed as a mask for a photoexposure radiation beam 30 which is employed in selectively photo-exposing the blanket photoresist layer 26. Both the photoexposure reticle 28 and the photoexposure radiation beam 30 are conventional in the art of microelectronics fabrication and are provided within the context of parameters and limits appropriate to the microelectronics fabrication within which is formed the blanket reflective layer 22.

Within the first preferred embodiment of the present invention, since the blanket organic polymer anti-reflective coating (ARC) layer 24 is formed of an organic polymer anti-reflective coating (ARC) material which is not susceptible to a hydrolysis reaction, the blanket organic polymer anti-reflective coating (ARC) layer 24 may be formed and exposed to ambient humidity, and subsequently have formed and thermally cured thereupon the blanket photoresist layer 26 while attenuating: (1) void formation within the blanket organic polymer anti-reflective coating (ARC) layer 24; and (2) delamination of the blanket organic polymer anti-reflective coating (ARC) layer 24 from the blanket reflective layer 22 or the blanket photoresist layer 26. By assuring attenuation of void formation within the blanket organic polymer anti-reflective coating (ARC) layer 24 and assuring attenuation of delamination of the blanket organic polymer anti-reflective coating (ARC) layer 24 from the blanket reflective layer 22 or the blanket photoresist layer 26, there is simultaneously assured a uniform and reproducible linewidth when forming a patterned reflective layer from the blanket reflective layer 22.

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the selectively photoexposed blanket photoresist layer 26 has been developed to form the patterned photoresist layer 26a. Within the first preferred embodiment of the present invention, the selectively photoexposed blanket photoresist layer 26 may be developed to form the patterned photoresist layer 26a through methods as are conventional in the art of microelectronics fabrication, which methods will typically include, but are not limited to, wet chemical photoresist developing methods. As is illustrated within the schematic cross-sectional diagram of FIG. 5, the patterned photoresist layer 26a is formed with straight sidewalls since there is attenuated within the first preferred embodiment of the present invention inhomogeneous standing wave photoexposure of the blanket photoresist layer 26 due to standing wave reflections from the blanket reflective layer 22 due to the presence of the blanket organic polymer anti-reflective coating (ARC) layer 24.

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the blanket organic polymer anti-reflective coating layer 24 and the blanket reflective layer 22 have been patterned to form the corresponding patterned organic polymer anti-reflective coating (ARC) layer 24a and the corresponding patterned reflective layer 22a, through use of an etching plasma 32, while employing the patterned photoresist layer 26a as an etch mask layer. Within the first preferred embodiment of the present invention, the etching plasma 32 is otherwise conventional in the art of microelectronics fabrication. The etching plasma 32 will typically sequentially employ: (1) an oxygen or nitrogen containing etchant gas composition in order to etch the blanket organic polymer anti-reflective coating (ARC) layer 24 when forming the patterned organic polymer anti-reflective coating layer 24a; followed by (2) an etchant gas composition appropriate to the material from which is formed the blanket reflective layer 22 in order to etch the blanket reflective layer 22 when forming the patterned reflective layer 22a. When employing an oxygen containing etchant gas composition to etch the blanket organic polymer anti-reflective coating (ARC) layer 24 when forming the patterned organic polymer anti-reflective coating (ARC) layer 24a there is typically and preferably employed conditions which minimally etch the patterend photoresist layer 26a.

Upon forming the microelectronics fabrication whose schematic cross-sectional diagram is illustrated in FIG. 6, there is formed a microelectronics fabrication having formed therein a patterned reflective layer with a uniform and reproducible linewidth. The patterned reflective layer is formed with the uniform and reproducible linewidth due in part to the presence of a blanket organic polymer anti-reflective coating (ARC) layer interposed between a blanket reflective layer from which is formed the patterned reflective layer and a blanket photoresist layer which is employed in forming a patterned photoresist layer which is employed in defining the patterned reflective layer. Similarly, since within the first preferred embodiment of the present invention the blanket organic polymer anti-reflective coating (ARC) layer is formed from an organic polymer anti-reflective coating (ARC) material which is not susceptible to a hydrolysis reaction, there is attenuated voids within the organic polymer anti-reflective coating (ARC) layer or delamination of the organic polymer anti-reflective coating (ARC) layer from layers adjoining the organic polymer anti-reflective coating (ARC) layer, which void formation or delamination would also otherwise contribute to forming the patterned layer with non-uniform and irreproducible linewidth dimension.

Second Preferred Embodiment

Figure 7A:
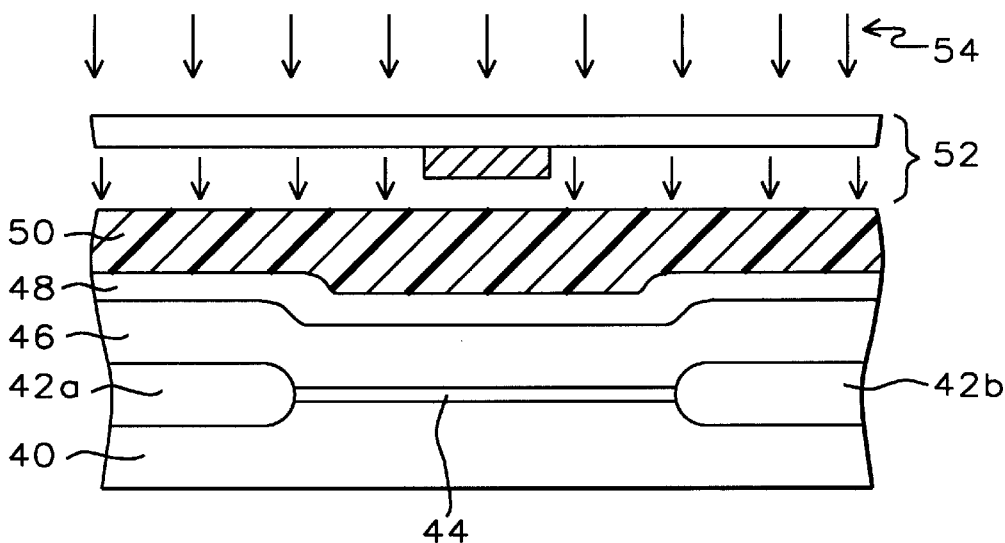
FIG. 7a to FIG. 12 show a series of schematic cross-sectional diagrams illustrating the results of forming, in accord with a more specific preferred embodiment of the present invention which comprises a second preferred embodiment of the present invention, a series of patterned reflective layers from a series of blanket reflective layers within an integrated circuit microelectronics fabrication while employing a pair of organic polymer anti-reflective coating (ARC) layers formed from an organic polymer anti-reflective coating (ARC) material in accord with the present invention.

Referring now to FIG. 7a to FIG. 12, there is shown a series of schematic cross-sectional diagrams illustrating the results of forming within an integrated circuit microelectronics fabrication in accord with a more specific embodiment of the present invention which comprises a second preferred embodiment of the present invention a series of patterned reflective layers including a gate electrode and an pair of patterned first conductor layers within the integrated circuit microelectronics fabrication. Shown in FIG. 7a is a schematic cross-sectional diagram of the integrated circuit microelectronics fabrication at an early stage in its formation in accord with the second preferred embodiment of the present invention.

Shown in FIG. 7a is a semiconductor substrate 40 having formed within and upon its surface a pair of isolation regions 42a and 42b which define an active region of the semiconductor substrate 40. Although semiconductor substrates are known in the art of integrated circuit microelectronics fabrication with either dopant polarity, several dopant concentrations and various crystallographic orientations, for the second preferred embodiment of the present invention, the semiconductor substrate 40 is preferably a (100) silicon semiconductor substrate having an N- or P-doping.

Similarly, although it is also known in the art of integrated circuit microelectronics fabrication that isolation regions may be formed within and or upon semiconductor substrates to define active regions of those semiconductor substrates through methods including but not limited to isolation region thermal growth methods and isolation region deposition/patterning methods, for the second preferred embodiment of the present invention, the isolation regions 42a and 42b are preferably formed within and upon the semiconductor substrate 40 to define the active region of the semiconductor substrate 40 through an isolation region thermal growth method at a temperature of from about 900 to about 1000 degrees centigrade to form the isolation regions 42a and 42b of silicon oxide within and upon the semiconductor substrate 40.

Shown also within FIG. 7a formed upon the active region of the semiconductor substrate is a blanket gate dielectric layer 44. Although it is known in the art of integrated circuit microelectronics fabrication that blanket gate dielectric layers may be formed through methods including but not limited to blanket gate dielectric layer thermal growth methods and blanket gate dielectric layer deposition/patterning methods, for the second preferred embodiment of the present invention, the blanket gate dielectric layer 44 is preferably formed through a blanket gate dielectric layer thermal growth method at a temperature of from about 900 to about 1000 degrees centigrade to form the blanket gate dielectric layer 44 of silicon oxide upon the active region of the semiconductor substrate 40.

Shown also within FIG. 7a formed upon the isolation regions 42a and 42b and the blanket gate dielectric layer 44 is a blanket gate electrode material layer 46. Within the second preferred embodiment of the present invention it is the blanket gate electrode material layer 46 which represents a blanket first reflective layer which is desired to be patterned into a reflective gate electrode while avoiding inhomogeneous photoexposures of a blanket photoresist layer employed in forming a patterned photoresist layer which defines the reflective gate electrode. Within the second preferred embodiment of the present invention, the blanket gate electrode material layer 46 may be formed from reflective gate electrode materials including but not limited to metals, metal alloys, doped polysilicon and polycides (doped polysilicon/metal silicide stacks). Preferably, the blanket gate electrode material layer 46 is formed from a doped polysilicon or a polycide gate electrode material. Preferably, the blanket gate electrode material layer is formed to a thickness of from about 1000 to about 5000 angstroms.

Shown also within FIG. 7a is a blanket organic polymer anti-reflective coating (ARC) layer 48 formed upon the blanket gate electrode material layer 46. Within the second preferred embodiment of the present invention, the blanket organic polymer anti-reflective coating (ARC) layer 48 is preferably formed employing methods and materials analogous or equivalent to the methods and materials employed in forming the blanket organic polymer anti-reflective coating layer 24 within the first preferred embodiment of the present invention, as illustrated in FIG. 4.

Shown also within FIG. 7a is a blanket photoresist layer 50 formed upon the blanket organic polymer anti-reflective coating (ARC) layer 48. Within the second preferred embodiment of the present invention, the blanket photoresist layer 50 is preferably formed employing methods and materials analogous or equivalent to the methods and materials employed in forming the blanket photoresist layer 26 within the first preferred embodiment of the present invention, as illustrated in FIG. 4.

Finally, there is shown in FIG. 7a a first photoexposure reticle 52 positioned above the blanket first photoresist layer 50 and a first photoexposure radiation beam 54 selectively exposing portions of the blanket first photoresist layer 50. Similarly with the blanket first organic polymer anti-reflective coating (ARC) layer 48 and the blanket first photoresist layer 50, the first photoexposure reticle 52 and the first photoexposure radiation beam 54 are preferably formed and employed in accord with methods and materials through which are formed and employed the photoexposure reticle 28 and the photoexposure radiation beam 30 within the first preferred embodiment of the present invention, as illustrated in FIG. 4.

Figure 8A:
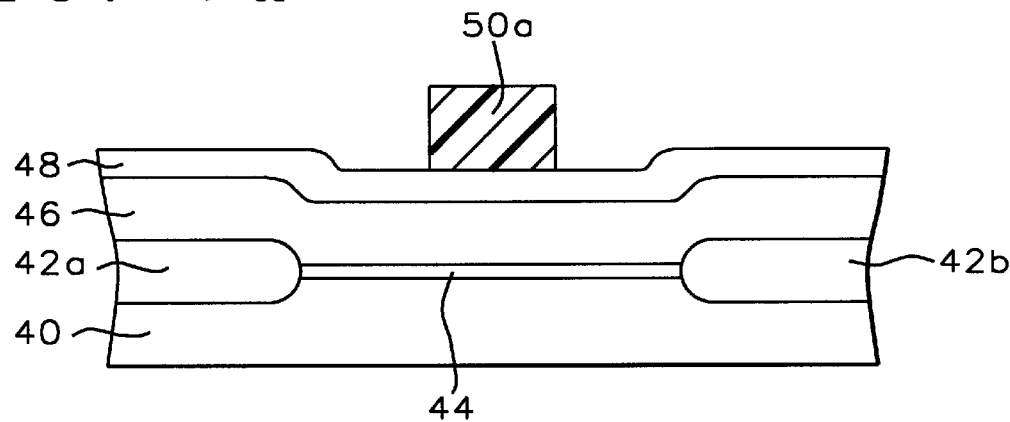

Referring now to FIG. 8a, there is shown a schematic cross-sectional diagram illustrating the results of further processing of the integrated circuit microelectronics fabrication whose schematic cross-sectional diagram is illustrated in FIG. 7a. Shown in FIG. 8a is a schematic cross-sectional diagram of an integrated circuit microelectronics fabrication otherwise equivalent to the integrated circuit microelectronics fabrication whose schematic cross-sectional diagram is illustrated in FIG. 7a, but wherein the photoexposed blanket first photoresist layer 50 has been developed to form the patterned first photoresist layer 50a. Within the second preferred embodiment of the present invention, the photoexposed blanket first photoresist layer 50 is developed to form the patterned first photoresist layer 50a through methods and materials analogous or equivalent to the methods and materials through which the selectively photoexposed blanket photoresist layer 26 is developed to form the patterned photoresist layer 26a within the first preferred embodiment of the present invention as illustrated within FIG. 4 and FIG. 5.

Figure 9A:
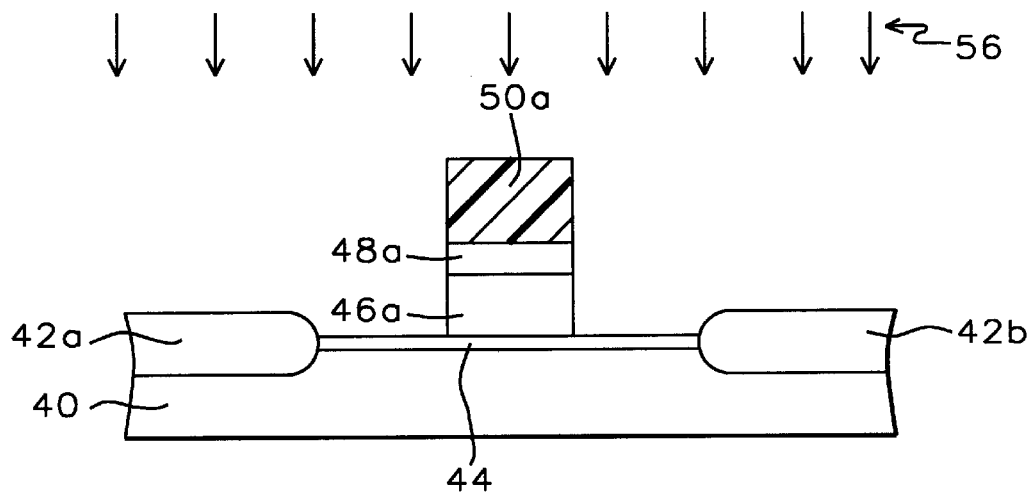

Referring now to FIG. 9a, there is shown a schematic cross-sectional diagram illustrating the results of further processing of the integrated circuit microelectronics fabrication whose schematic cross-sectional diagram is illustrated in FIG. 8a. Shown in FIG. 9a is a schematic cross-sectional diagram of an integrated circuit microelectronics fabrication otherwise equivalent to the integrated circuit microelectronics fabrication whose schematic cross-sectional diagram is illustrated in FIG. 8a, but wherein the blanket first organic polymer anti-reflective coating (ARC) layer 48 and the blanket gate electrode material layer 46 have been patterned through use of a first etching plasma 56, while employing the patterned first photoresist layer 50a as an etch mask, to form a corresponding patterned first organic polymer anti-reflective coating (ARC) layer 48a and a corresponding gate electrode 46a. Within the second preferred embodiment of the present invention, where the blanket first organic polymer anti-reflective coating (ARC) layer 48 is formed from an organic polymer not susceptible to hydrolysis, and the blanket gate electrode material layer 46 is formed from a polysilicon or polycide gate electrode material, the first etching plasma 56 preferably employs a series of etchant gas composition comprising: (1) an oxygen or nitrogen containing etchant gas composition for etching the blanket first organic polymer anti-reflective coating (ARC) layer 48 when forming the patterned first organic polymer anti-reflective coating (ARC) layer 48a; followed by (2) a chlorine and hydrogen bromide containing etchant gas composition for etching the blanket gate electrode material layer 46 when forming the gate electrode 46a.

Upon forming the integrated circuit microelectronics fabrication whose schematic cross-sectional diagram is illustrated in FIG. 9a, there is formed an integrated circuit microelectronics fabrication having formed therein a reflective gate electrode with uniform and reproducible linewidth dimension, since the reflective gate electrode is formed in part employing a photolithographic method which employs a blanket organic polymer anti-reflective coating (ARC)

layer formed interposed between a blanket gate electrode material layer from which is formed the reflective gate electrode and a blanket photoresist layer from which is formed a patterned photoresist layer which defines the reflective gate electrode. Since within the second preferred embodiment of the present invention, similarly with the first preferred embodiment of the present invention, the blanket organic polymer anti-reflective coating (ARC) layer employs an organic polymer which is not susceptible to a hydrolysis reaction, there is additionally attenuated void formation within or through the blanket organic polymer anti-reflective coating (ARC) layer or delamination of the organic polymer anti-reflective coating (ARC) layer from layers adjoining the blanket organic polymer anti-reflective coating layer. Such attenuated void formation and attenuated delamination also contribute to forming within the second preferred embodiment of the present invention the reflective gate electrode with uniform and reproducible linewidth dimension.

Referring now to FIG. 7b to FIG. 9b, there is shown a series of schematic cross-sectional diagrams illustrating the early stages of forming a microelectronics fabrication in accord with an alternative second preferred embodiment of the present invention. Shown in FIG. 7b to FIG. 9b is a series of schematic cross-sectional diagrams of a microelectronics fabrication otherwise equivalent to the microelectronics fabrication whose schematic cross-sectional diagram is illustrated in FIG. 7a to FIG. 9a, but wherein in place of the isolation regions 42a and 42b formed employing a thermal oxidation method, there is formed a pair of shallow trench isolation (STI) regions 43a and 43b employing a shallow trench isolation (STI) method as is conventional in the art of integrated circuit microelectronics fabrication. Shallow trench isolation (STI) regions are desirable within the art of microelectronics fabrication since shallow trench isolation (STI) regions provide a nominally planar substrate upon which may be formed integrated circuit microelectronics devices and structures.

While either the microelectronics fabrication whose schematic cross-sectional diagrams are illustrated within FIG. 7a to FIG. 9a or the alternative microelectronics fabrication whose schematic cross-sectional diagrams are illustrated within FIG. 7b to FIG. 9b may be employed equivalently within the second preferred embodiment of the present invention, the remaining description of the second preferred embodiment of the present invention will follow from the microelectronics fabrication whose schematic cross-sectional diagrams are illustrated in FIG. 7a to FIG. 9a.

Figures 9B, 10:
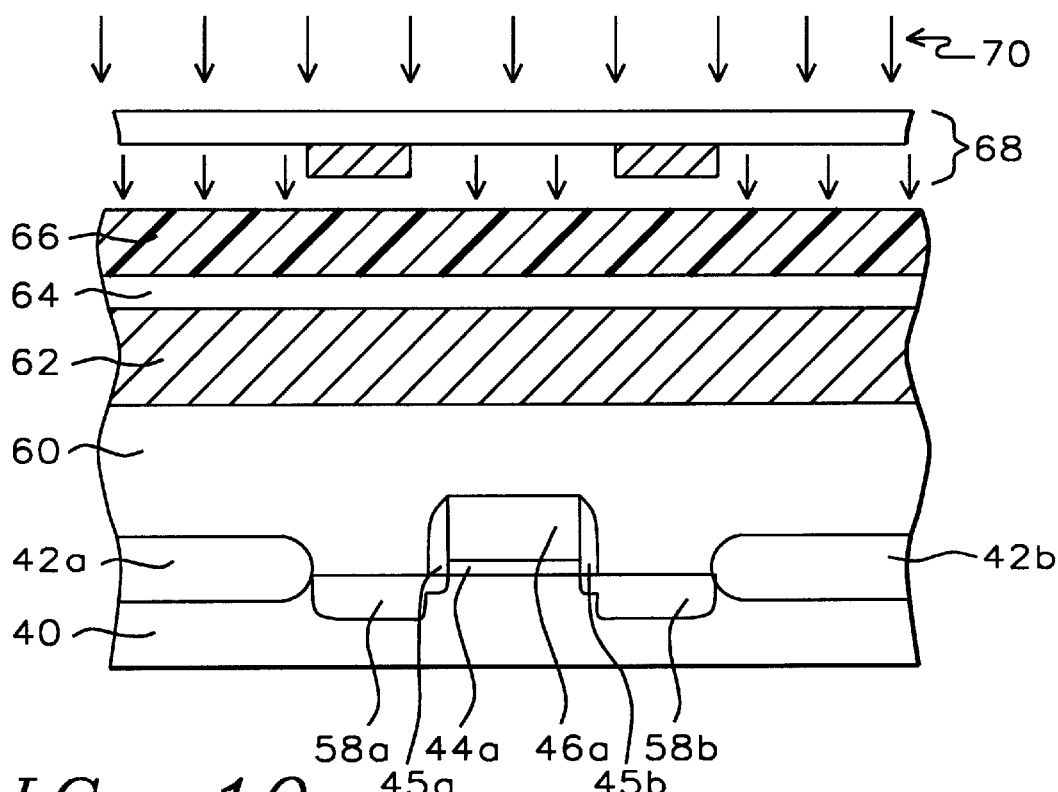

Referring now to FIG. 10, there is shown a schematic cross-sectional diagram illustrating the results of further processing of the integrated circuit microelectronics fabrication whose schematic cross-sectional diagram is illustrated in FIG. 9a. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9a, but wherein there has been stripped from the gate electrode 46a the patterned first photoresist layer 50a and the patterned organic polymer anti-reflective coating (ARC) layer 48a. The patterned first photoresist layer 50a and the patterned organic polymer anti-reflective coating (ARC) layer 48a may be stripped from the integrated circuit microelectronics fabrication whose schematic cross-sectional diagram is illustrated in FIG. 9a to provide the integrated circuit microelectronics fabrication whose schematic cross-sectional diagram is illustrated in FIG. 10 through methods as are conventional in the art of integrated circuit microelectronics fabrication. Such methods typically include, but are not limited to dry oxygen plasma stripping methods and wet chemical stripping methods.

There is also shown in FIG. 10 a patterned gate dielectric layer 44a formed from the blanket gate dielectric layer 44. The patterned gate dielectric layer 44a may be formed from the blanket gate dielectric layer 44 employing methods as are conventional in the art of microelectronics fabrication, such methods typically including, but not limited to wet chemical etch methods and dry plasma etch methods.

Similarly, there is also shown in FIG. 10 formed adjoining a pair of opposite edges of the gate electrode 46a and the patterned gate dielectric layer 44a a pair of insulator spacer layers 45a and 45b. The pair of insulator spacer layers 45a and 45b is preferably formed by anisotropic reactive ion etch etching, while employing a method as is conventional in the art, of a blanket dielectric layer formed of a silicon oxide, a silicon nitride or a silicon oxynitride dielectric material, as is similarly conventional in the art of microelectronics fabrication.

There is also shown in FIG. 10 formed into portions of the active region of the semiconductor substrate 40 not covered by the gate dielectric layer 44a and the gate electrode 46a a pair of source/drain regions 58a and 58b. The source/drain regions 58a and 58b may be formed through methods as are conventional in the art of integrated circuit microelectronics fabrication, which methods will typically include ion implantation methods employing implanting dopant ions of polarity appropriate to a field effect transistor formed in conjunction with the gate dielectric layer 44a and the gate electrode 46a. The ion implantation methods will typically employ a lower dose ion implant while employing the gate dielectric layer 44a and the gate electrode 46a as a first mask followed by a higher dose ion implant while employing the gate dielectric layer 44a, the gate electrode 46a and the dielectric spacer layers 45a and 45b as a second mask.

Shown also within FIG. 10 is a blanket planarized pre-metal dielectric (PMD) layer 60 formed over the semiconductor substrate 40 including the series of structures which comprises the field effect transistor (FET). Methods and materials through which blanket planarized pre-metal dielectric (PMD) layers may be formed within integrated circuit microelectronics fabrications are known in the art of integrated circuit microelectronics fabrication. Blanket planarized pre-metal dielectric (PMD) layers may be formed within integrated circuit microelectronics fabrications through planarizing, through chemical mechanical polish (CMP) planarizing methods and reactive ion etch (RIE) etchback planarizing methods as are known in the art of integrated circuit microelectronics fabrication, of blanket conformal pre-metal dielectric (PMD) layers formed within integrated circuit microelectronics fabrications. Blanket conformal pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods through which may be formed blanket conformal pre-metal dielectric (PMD) layers of dielectric materials including but not limited to silicon oxide dielectric materials, silicon nitride dielectric materials and silicon oxynitride dielectric materials. For the second preferred embodiment of the present invention, the blanket planarized pre-metal dielectric (PMD) layer 60 is preferably formed of a silicon oxide dielectric material deposited employing a plasma enhanced chemical vapor deposition (PECVD) method and planarized employing a chemical mechanical polish (CMP) planarizing method, as is common in the art of integrated circuit microelectronics fabrication. Preferably the blanket planarized pre-metal dielectric (PMD) layer 60 is formed to a thickness of from about 3000 to about 15000 angstroms.

Finally, there is shown also in FIG. 10 formed upon the blanket planarized pre-metal dielectric (PMD) layer 60 a series of blanket layers including: (1) a blanket first conductor layer 62 having formed thereupon; (2) a blanket second organic polymer anti-reflective coating (ARC) layer 64 in turn having formed thereupon; (3) a blanket second photoresist layer 66. Within the second preferred embodiment of the present invention, the blanket first conductor layer 62 comprises a blanket second reflective layer which is desired to be patterned with uniform and reproducible linewidth in accord with the method of the present invention.

The blanket first conductor layer 62 may be formed of any reflective conductor materials as are conventionally employed within integrated circuit microelectronics fabrication, such reflective conductor materials including but not limited to metals, metal alloys, doped polysilicon and polycides. For the second preferred embodiment of the present invention, the blanket first conductor layer 62 is preferably formed at least in part of an aluminum containing conductor material, as is most common in the art of integrated circuit microelectronics fabrication. Preferably, the blanket first conductor layer 62 is formed to a thickness of from about 3000 to about 10000 angstroms upon the blanket planarized pre-metal dielectric (PMD) layer 60.

Figure 7B:
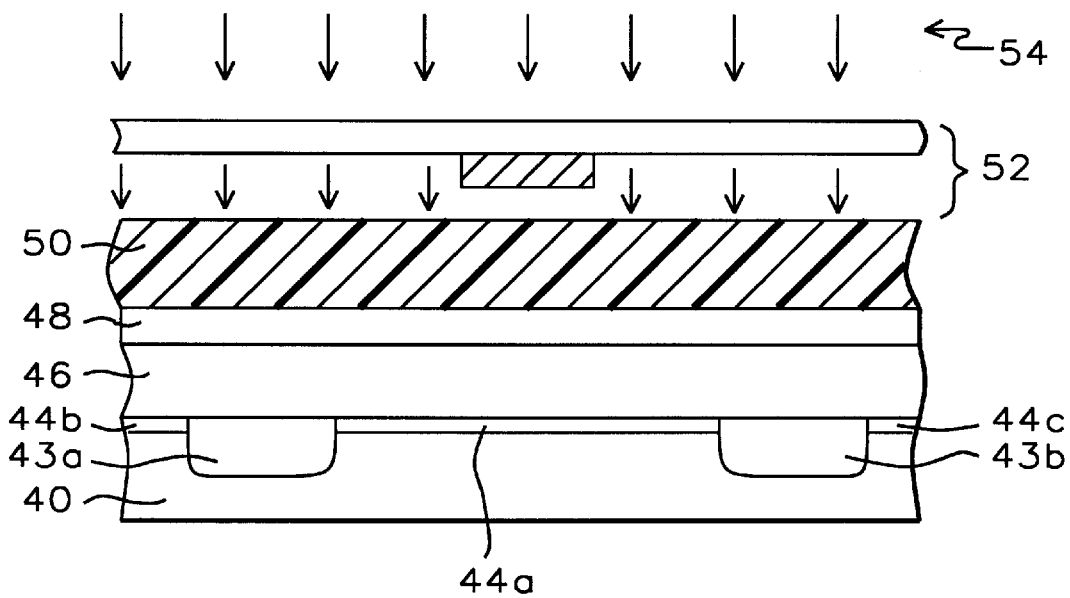

With respect to the blanket second organic polymer anti-reflective coating layer 64 and the blanket second photoresist layer 66, within the second preferred embodiment of the present invention the blanket second organic polymer anti-reflective coating layer 64 is preferably formed employing methods, materials and dimensions analogous or equivalent to the methods, materials and dimensions employed in forming the blanket first organic polymer anti-reflective coating layer 48 as illustrated within FIG. 7a and FIG. 7b, while the blanket second photoresist layer 66 is preferably formed employing methods, materials and dimensions analogous or equivalent to the methods, materials and dimensions employed in forming the blanket first photoresist layer 50 as similarly illustrated within FIG. 7a and FIG. 7b.

Finally, there is shown in FIG. 10 a second photoexposure reticle 68 positioned above the blanket second photoresist layer 66, where there is selectively photoexposed portions of the blanket second photoresist layer 66 with a second photoexposure radiation beam 70 incident upon the second photoexposure reticle 68. Within the second preferred embodiment of the present invention, the second photoexposure reticle 68 and the second photoexposure radiation beam 70 are analogous or equivalent to the corresponding first photoexposure reticle 52 and the corresponding first photoexposure radiation beam 54 as illustrated within the schematic cross-sectional diagram of FIG. 7a and FIG. 7b.

Figure 8B:
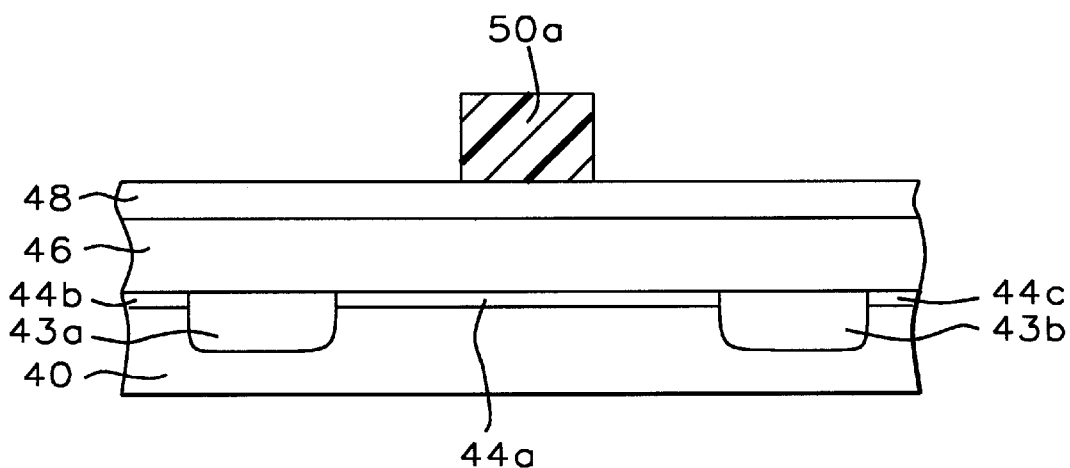
Figure 11:
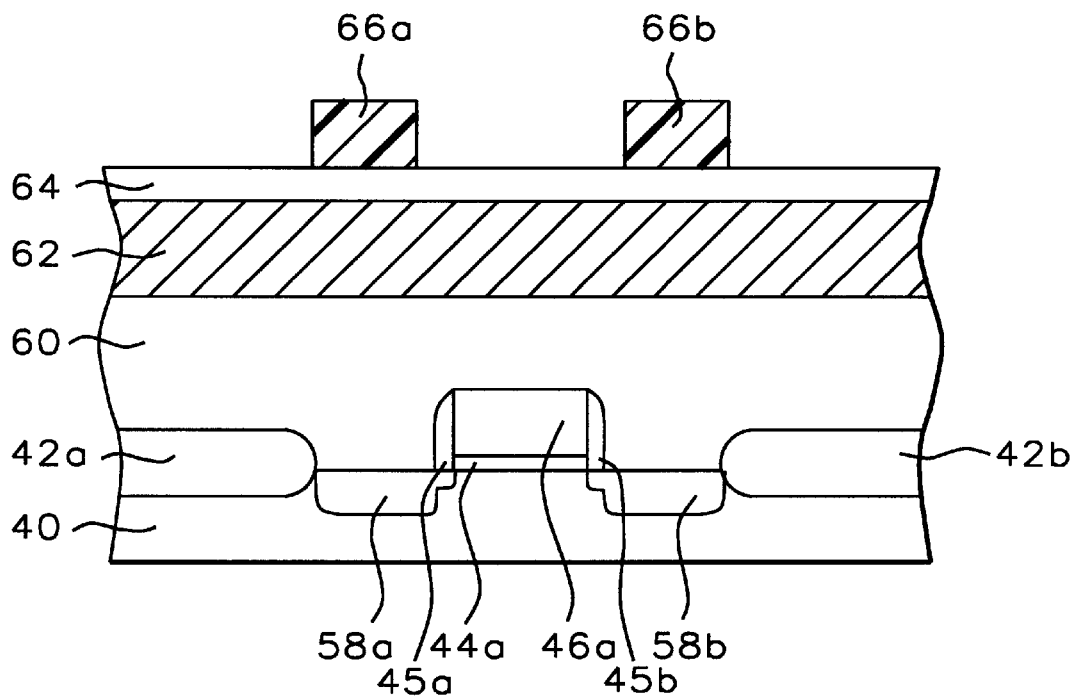

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 10, but wherein the selectively photoexposed blanket second photoresist layer 66 has been developed to form the patterned second photoresist layers 66a and 66b. Within the second preferred embodiment of the present invention, the photoexposed blanket second photoresist layer 66 is patterned to form the patterned second photoresist layer 66a and 66b employing methods and materials analogous or equivalent to the methods and materials through which the photoexposed blanket first photoresist layer 50 as illustrated in FIG. 7a and FIG. 7b is developed to form the patterned first photoresist layer 50a as illustrated in FIG. 8a and FIG. 8b.

Figure 12:
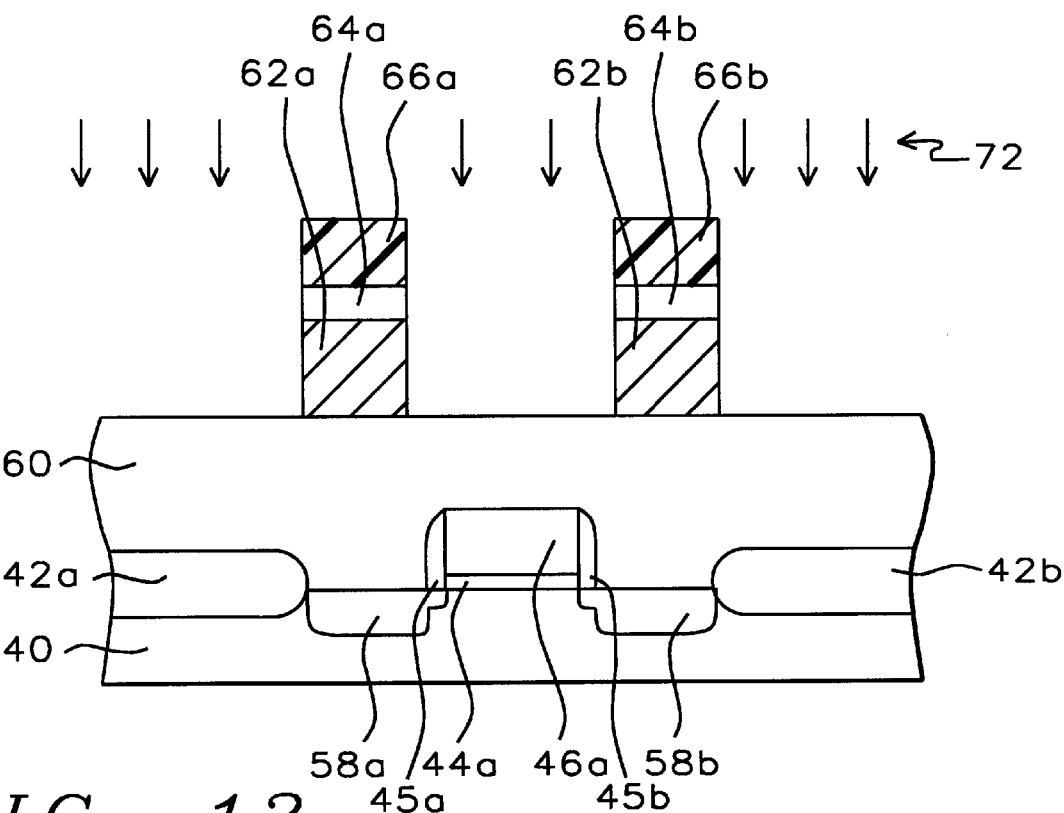

Referring now to FIG. 12, there is shown a schematic cross-sectional diagram illustrating the results of further processing of the integrated circuit microelectronics fabrication whose schematic cross-sectional diagram is illustrated in FIG. 11. Shown in FIG. 12 is a schematic cross-sectional diagram of an integrated circuit microelectronics fabrication otherwise equivalent to the integrated circuit microelectronics fabrication whose schematic cross-sectional diagram is illustrated in FIG. 11, but wherein the blanket second organic polymer anti-reflective coating layer 64 and the blanket first conductor layer 62 have been patterned to form the corresponding patterned second organic polymer anti-reflective coating layers 64a and 64b and the corresponding patterned first conductor layers 62a and 62b through use of a second etching plasma 72 while employing the patterned second photoresist layers 66a and 66b as etch mask layers. Within the second preferred embodiment of the present invention, where the blanket second organic polymer anti-reflective coating (ARC) layer 64 is formed of an organic polymer material not susceptible to a hydrolysis reaction and the blanket first conductor layer 62 is formed at least in part of an aluminum containing conductor material, the second etching plasma 72 preferably employs a sequence of etchant gas compositions comprising: (1) an oxygen or nitrogen containing etchant gas for etching the blanket second organic polymer anti-reflective coating (ARC) layer 64 when forming the patterned second organic polymer anti-reflective coating (ARC) layers 64a and 64b; followed by (2) a boron trichloride containing etchant gas for etching the blanket first conductor layer 62 when forming the patterned first conductor layers 62a and 62b.

Upon forming the integrated circuit microelectronics fabrication whose schematic cross-sectional diagram is illustrated in FIG. 12, there is formed an integrated circuit microelectronics fabrication having formed therein in addition to a reflective gate electrode formed with uniform and reproducible linewidth dimension a pair of reflective patterned first conductor layers formed of uniform and reproducible linewidth dimensions. Similarly with the reflective gate electrode, the reflective patterned first conductor layers are also formed with uniform and reproducible linewidth due to incorporation of a blanket organic polymer anti-reflective coating (ARC) layer interposed between a blanket first conductor layer from which is formed the patterned first conductor layers and a blanket second photoresist layer from which is formed a patterned first photoresist layer which is employed in defining the patterned first conductor layers. Since the blanket organic polymer anti-reflective coating (ARC) layer is formed of an organic polymer which is not susceptible to a hydrolysis reaction, the blanket organic polymer anti-reflective coating (ARC) layer has attenuated void formation within the organic polymer anti-reflective coating (ARC) layer and attenuated delamination of the organic polymer anti-reflective coating (ARC) layer from layers adjoining the organic polymer anti-reflective coating (ARC) layer, which voids or delamination would otherwise contribute to non-uniform or irreproducible linewidths of the patterned first conductor layers.

As is understood by a person skilled in the art, the preferred embodiments of the present invention are illustrative of the present invention rather than limiting of the present invention. Revisions and modifications may be made to methods, materials, structures and dimensions through which is formed a microelectronics fabrication in accord within the preferred embodiments of the present invention while still providing microelectronics fabrications formed in accord with the spirit and scope of the present invention, as defined by the appended claims.

What is claimed is:

1. A method for forming an anti-reflective coating (ARC) layer comprising:

providing a substrate;

forming over the substrate a reflective layer;

forming upon the reflective layer an organic polymer anti-reflective coating (ARC) layer, the organic polymer anti-reflective coating (ARC) layer being formed from a polyorthoaminophenol organic polymer material.

2. The method of claim 1 wherein substrate is employed within a microelectronics fabrication selected from the group consisting of integrated circuit microelectronics fabrications, solar cell microelectronics fabrications, ceramic substrate microelectronics fabrications and flat panel display microelectronics fabrications.

3. The method of claim 1 wherein the reflective layer is selected from the group of reflective layers consisting of reflective conductor layers, reflective semiconductor layers and reflective conductor layers.

4. The method of claim 1 wherein the polyorthoaminophenol organic polymer material is not susceptible to a hydrolysis reaction.

5. The method of claim 1 further comprising:

forming a photoresist layer upon the anti-reflective coating (ARC) layer;

photoexposing and developing the photoresist layer to form a patterned photoresist layer; and etching while employing the patterned photoresist layer as a photoresist etch mask layer the reflective layer to form a patterned reflective layer.

6. A microelectronics fabrication having formed therein a patterned reflective layer in accord with the method of claim 5.

7. A microelectronics fabrication having formed therein an anti-reflective coating (ARC) layer in accord with the method of claim 1.

8. A fabrication having formed therein a reflective layer comprising:

a substrate;

a reflective layer formed over the substrate;

an anti-reflective coating (ARC) layer formed upon the reflective layer, where the anti-reflective coating (ARC) layer is formed of a polyorthoaminophenol organic polymer material.

9. The fabrication of claim 8 wherein the substrate is employed within a microelectronics fabrication selected from the group consisting of integrated circuit microelectronics fabrications, solar cell microelectronics fabrications, ceramic substrate microelectronics fabrications and flat panel display microelectronics fabrications.

10. The fabrication of claim 8 wherein the reflective layer is selected from the group consisting of reflective conductor layers, reflective semiconductor layers and reflective dielectric layers.

11. The fabrication of claim 8 wherein the polyorthoaminophenol organic polymer material is not susceptible to a hydrolysis reaction.

* * * * *